US 12,283,496 B2

(12) United States Patent
Takashima (10) Patent No.: US 12,283,496 B2
(45) Date of Patent: Apr. 22, 2025

(54) MULTI-ZONE HEATER (71) Applicant: NGK INSULATORS, LTD., Nagoya (JP)

(72) Inventor: Keisuke Takashima, Toyohashi (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 18/353,221

(22) Filed: Jul. 17, 2023

(65) Prior Publication Data
US 2024/0274446 A1    Aug. 15, 2024

Related U.S. Application Data (63) Continuation of application No. PCT/JP2023/004621, filed on Feb. 10, 2023.

(51) Int. Cl.
*H01L 21/67* (2006.01)
*H01L 21/687* (2006.01)
*H05B 3/28* (2006.01)

(52) U.S. Cl.
CPC .. *H01L 21/67103* (2013.01); *H01L 21/68742* (2013.01); *H05B 3/283* (2013.01); *H05B 2203/005* (2013.01)

(58) Field of Classification Search
CPC ......... H01L 21/02002; H01L 21/67103; H01L 21/67126; H01L 21/67248;
(Continued)

(56) References Cited

U.S. PATENT DOCUMENTS

2003/0062359 A1    4/2003   Ho et al.
2004/0108308 A1*   6/2004   Okajima ........... H01L 21/67109
                                                    219/468.1
(Continued)

FOREIGN PATENT DOCUMENTS

JP          3182120 U       3/2013
JP       2016-115933 A      6/2016
(Continued)

OTHER PUBLICATIONS

International Search Report (Application No. PCT/JP2023/004621) dated Apr. 25, 2023 (3 pages).
(Continued)

*Primary Examiner* — Sang Y Paik
(74) *Attorney, Agent, or Firm* — BURR PATENT LAW, PLLC (57) ABSTRACT A multi-zone heater capable of heating a wafer mounted on a disc-shaped ceramic substrate includes: a plurality of lift pin holes which are provided in the substrate; an inner zone heater embedded in an inner zone of the ceramic substrate; an outer zone heater embedded in an outer zone outside the inner zone; first and second feed terminals to which opposite ends of the inner zone heater are connected; first and second leads to which opposite ends of the outer zone heater are connected; and third and fourth feed terminals to which the first and second leads are respectively connected, the plurality of lift pin holes, the inner zone heater, and the outer zone heater are arranged to be symmetric with respect to a common axis of symmetry, and the first and second leads are arranged along the axis of symmetry to be symmetric to each other.

7 Claims, 8 Drawing Sheets (58) Field of Classification Search
CPC ........ H01L 21/68785; H01L 21/68792; H05B
1/0233; H05B 2203/002; H05B 2203/005;
H05B 2203/037; H05B 3/283
USPC ..................................................... 219/444.1
See application file for complete search history.

(56) References Cited

U.S. PATENT DOCUMENTS

| | | | |
|---|---|---|---|
| 2006/0011610 A1* | 1/2006 | Kondou | H01L 21/67103 |
| | | | 219/444.1 |
| 2008/0302781 A1 | 12/2008 | Murakami et al. | |
| 2018/0261486 A1 | 9/2018 | Anada et al. | |
| 2020/0396801 A1 | 12/2020 | Unno et al. | |
| 2021/0120633 A1* | 4/2021 | Nobori | H01L 21/02 |
| 2021/0227639 A1 | 7/2021 | Ishikawa et al. | |
| 2021/0235548 A1 | 7/2021 | Ishikawa et al. | |
| 2021/0243850 A1* | 8/2021 | Ishikawa | H05B 3/265 |
| 2022/0124874 A1 | 4/2022 | Inoue et al. | |
| 2024/0064869 A1* | 2/2024 | Yoo | H05B 3/265 |

FOREIGN PATENT DOCUMENTS

| | | |
|---|---|---|
| JP | 2020-161284 A | 10/2020 |
| JP | 2022-065943 A | 4/2022 |
| KR | 10-2005-0054952 A | 6/2005 |
| KR | 10-2017-0052338 A | 5/2017 |
| KR | 10-2020-0120720 A | 10/2020 |
| WO | 2006/004045 A1 | 1/2006 |
| WO | 2019/181500 A1 | 9/2019 |
| WO | 2020/153079 A1 | 7/2020 |
| WO | 2020/153086 A1 | 7/2020 |
| WO | 2020/153218 A1 | 7/2020 |

OTHER PUBLICATIONS

International Written Opinion (Application No. PCT/JP2023/004621) dated Apr. 25, 2023 (with English translation) (8 pages).
English translation of the International Search Report dated Apr. 25, 2023 (Application No. PCT/JP2023/004621).
Korean Office Action dated Dec. 9, 2023 (Application No. 10-2023-7024848).

* cited by examiner

MULTI-ZONE HEATER

BACKGROUND OF THE INVENTION

Field of the Invention

The present invention relates to a multi-zone heater to heat a semiconductor wafer.

Description of the Background Art

A ceramic heater is widely used as a heater to heat a wafer in a semiconductor manufacturing apparatus. As such a ceramic heater, a so-called multi-zone heater configured to heat a plurality of zones with separate heaters is known. Already known as one type of the multi-zone heater is a two-zone heater including a heating element (coil) to heat a central portion (an inner zone) of a disc-shaped ceramic substrate and a heating element (coil) to heat an outer peripheral portion (outer zone) embedded in one plane in the ceramic substrate, and capable of applying voltages to the respective heating elements independently of each other to control heat generation from the respective heating elements independently of each other (see WO 2019/181500 and WO 2006/004045, for example).

In a case of a multi-zone heater that heats an inner zone and an outer zone with different heating elements as disclosed in WO 2019/181500, the heating elements in the respective zones are generally arranged in a plurality of arcs concentric with a disc-shaped ceramic substrate. Connection terminals responsible for external feeding are arranged in a central portion of the ceramic substrate. A heating element disposed in the inner zone is directly connected to a connection terminal, whereas a heating element disposed in the outer zone is connected to a connection terminal via a lead connecting an end of the heating element and the connection terminal.

The lead, however, is required to be disposed across the inner zone. The heating element for the inner zone is thus bent at least in a portion of the inner zone around the lead. As a result, the radius of curvature of the heating element in the bent portion is significantly different from that in the arcuate portion. The heating elements may be bent at another position including a position in the outer zone depending on a heating element arrangement pattern.

As disclosed in WO 2006/004045, a semiconductor manufacturing apparatus including a ceramic heater sometimes includes support pins (lift pins) capable of supporting a wafer mounted on an upper surface of a ceramic substrate from below and lifting the wafer. The lift pins are insertable into through holes (lift pin holes) provided at predetermined positions in the ceramic substrate. In a case of a ceramic heater having the lift pin holes, heating elements are required to be arranged to avoid (circumvent) the lift pin holes. The radius of curvature of the heating element at positions where the lift pin holes are avoided as described above is also significantly different from that in the arcuate portion.

It is usually desirable for the ceramic heater to heat the wafer as uniformly as possible (have high thermal uniformity) in a wafer plane in terms of improvement in productivity of the semiconductor manufacturing apparatus. That is to say, it is desirable to minimize a temperature variation in the wafer plane when the wafer is heated.

The multi-zone heater, however, tends to have poor uniformity of temperature distribution at the position where the heating element is bent as described above.

In a case of the ceramic heater having the lift pin holes, the ceramic heater tends to have poor uniformity of temperature distribution also at the positions where the lift pin holes are avoided.

That is to say, the multi-zone heater having the lift pin holes tends to have poor uniformity of temperature distribution at singular points (curvature radius singular points) where the radius of curvature is significantly different from that in a normal arcuate portion.

It is believed that this results from a difference in deformation of the heating element in a process of manufacturing the ceramic heater. That is to say, it is believed that, the heating element is embedded in a compact of a ceramic material typified by aluminum nitride, silicon carbide, silicon nitride, aluminum oxide, and the like, and then the compact is fired at a temperature of more than 1500° C. while being subjected to a load in tons to yield the ceramic heater, and therefore, the completed ceramic heater has a heat generation variation at the curvature radius singular points due to a difference in deformation behavior of the heating element during firing between the curvature radius singular points and the normal portion.

A plurality of types of heating elements having different heat generation densities due to a difference in thickness, material, and the like of the heating elements are sometimes used to secure thermal uniformity but are not necessarily suitable for application to the curvature radius singular points.

Another way of thinking is that many curvature radius singular points are provided to increase thermal uniformity but is not realistic in view of design complexity, costs, and the like.

As a result of diligent examination to secure thermal uniformity of the multi-zone heater having the lift pin holes, the inventor of the present invention has devised a configuration capable of suitably securing thermal uniformity while having the curvature radius singular points by comprehensively examining positions where the lift pin holes are arranged and positions where leads connecting the heating element disposed in the outer zone and connection terminals for feeding are arranged.

SUMMARY

The present invention relates to a multi-zone heater to heat a semiconductor wafer and is, in particular, directed to an arrangement relationship among components thereof.

According to the present invention, a multi-zone heater includes: a disc-shaped ceramic substrate having one main surface to be a wafer mounting surface, the multi-zone heater being capable of heating a wafer mounted on the one main surface; a plurality of lift pin holes which are provided in the ceramic substrate and into which lift pins to lift the wafer are insertable; an inner zone heater embedded in an inner zone of the ceramic substrate; an outer zone heater embedded in an outer zone outside the inner zone of the ceramic substrate; a first feed terminal and a second feed terminal which are arranged in a central portion of the ceramic substrate and to which opposite ends of the inner zone heater are connected; a first lead and a second lead to which opposite ends of the outer zone heater are connected; and a third feed terminal and a fourth feed terminal which are arranged in the central portion of the ceramic substrate and to which the first lead and the second lead are respectively connected. The plurality of lift pin holes, the inner zone heater, and the outer zone heater are arranged to be symmetric with respect to a common axis of symmetry, and the first lead and the second lead are arranged along the axis of symmetry to be symmetric to each other.

According to the present invention, thermal uniformity at the wafer mounting surface when the heater performs heating can be increased compared with a multi-zone heater in which the leads are not arranged along the axis of symmetry.

It is thus an object of the present invention to improve thermal uniformity of a multi-zone heater having lift pin holes.

These and other objects, features, aspects and advantages of the present invention will become more apparent from the following detailed description of the present invention when taken in conjunction with the accompanying drawings.

DESCRIPTION OF THE PREFERRED EMBODIMENT

<Configuration of Multi-Zone Heater>

Figure 1:
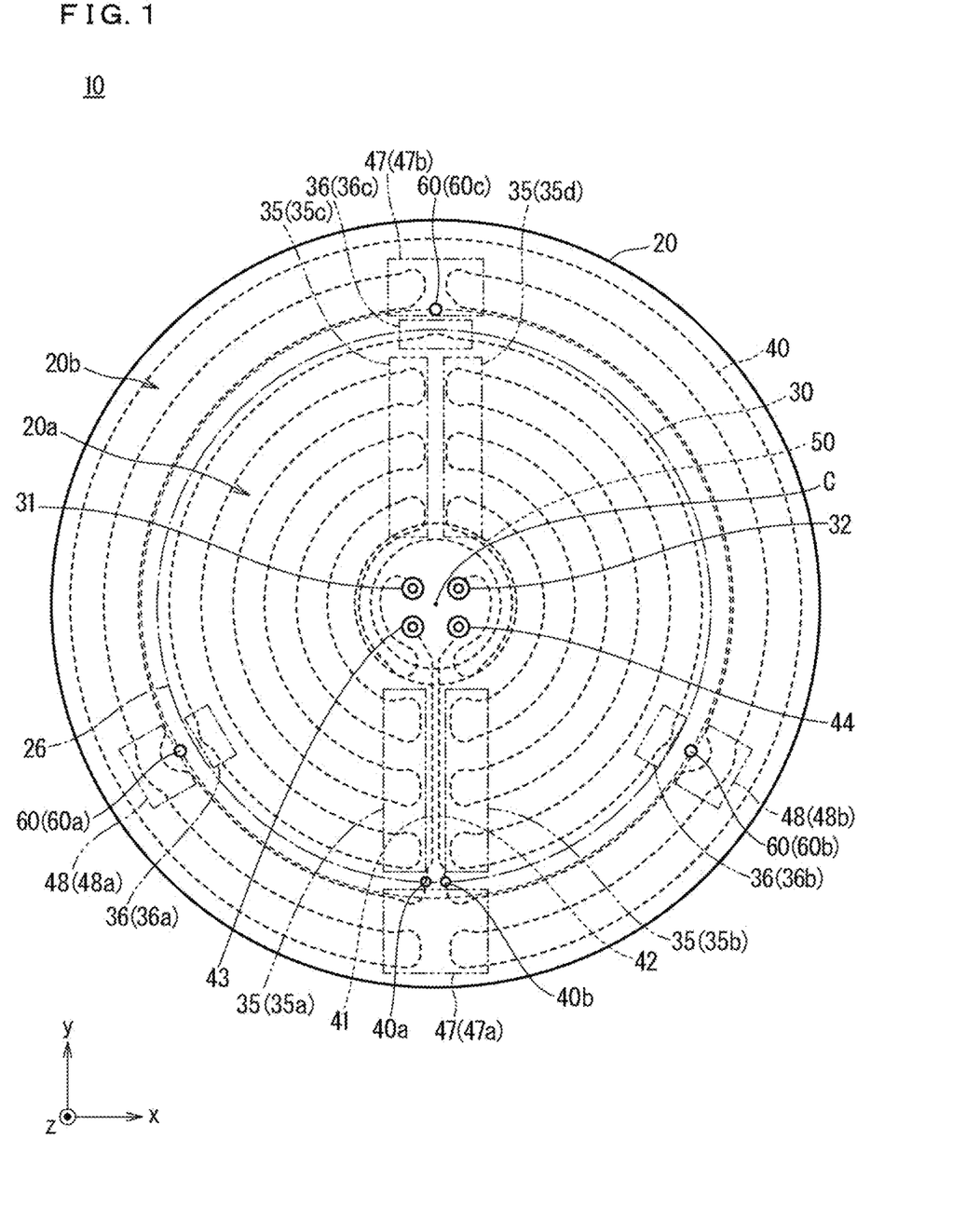
FIG. 1 is a schematic plan view of a multi-zone heater 10.
Figure 2:
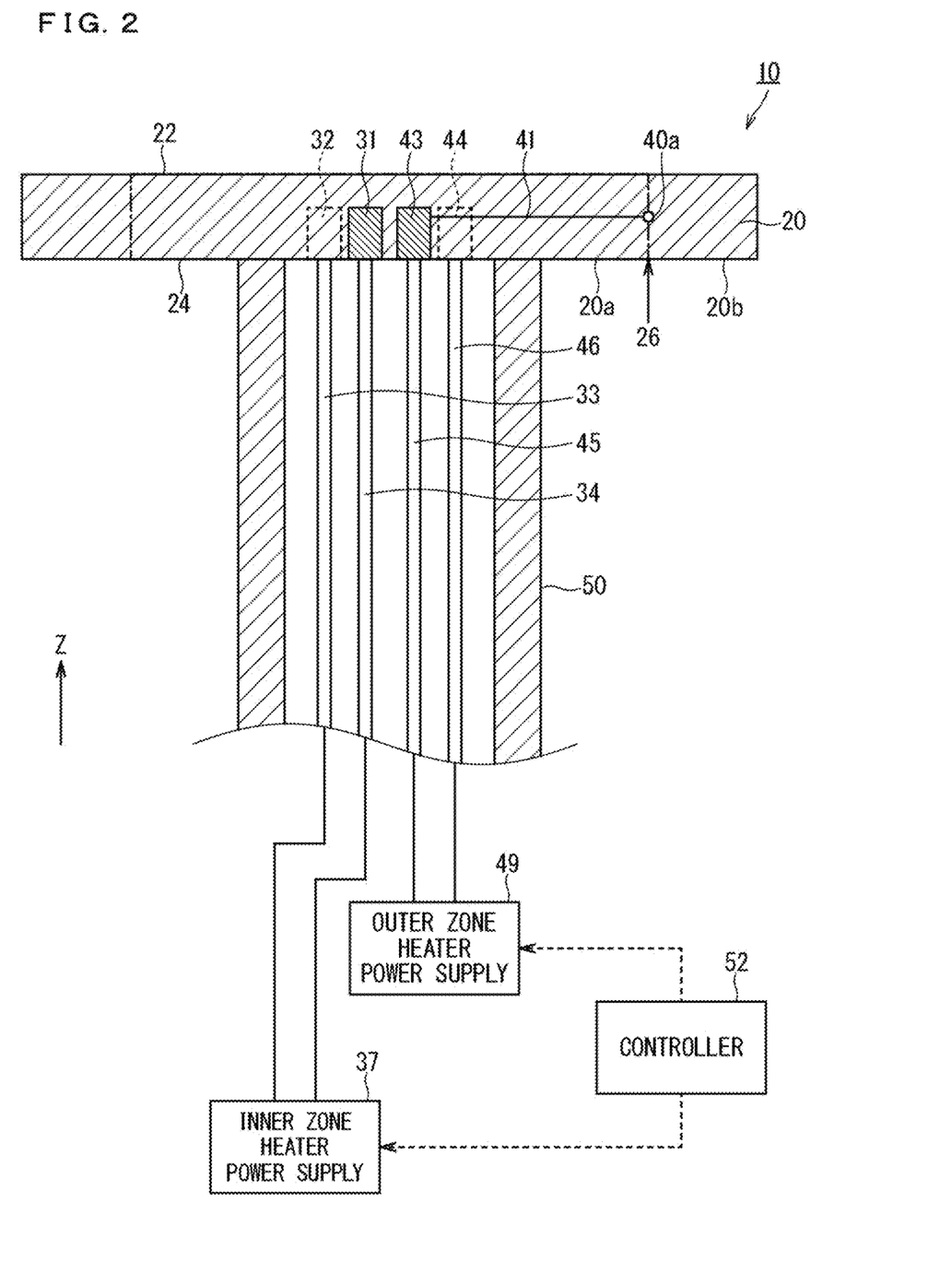
FIG. 2 is a schematic sectional view of the multi-zone heater 10.

FIG. 1 is a schematic plan view of a multi-zone heater 10 according to an embodiment of the present invention. FIG. 2 is a schematic sectional view of the multi-zone heater 10. FIG. 1 is accompanied by right-handed xyz coordinates with a horizontal direction in FIG. 1 as an x-axis direction, and a z-axis direction in FIG. 2 coincides with that in FIG. 1.

The multi-zone heater 10 is used as a support (susceptor) to support a semiconductor wafer from below in a semiconductor wafer heating step as one step of a semiconductor manufacturing process. A more specific example of the heating step includes heating of the wafer in a step of forming a semiconductor thin film over the wafer by plasma CVD. Assume in the present embodiment that the multi-zone heater 10 is incorporated in an unillustrated semiconductor manufacturing apparatus, such as a known plasma CVD apparatus, to be used.

The multi-zone heater 10 mainly includes a ceramic substrate 20, an inner zone heater 30, an outer zone heater 40, a first lead 41, a second lead 42, and a shaft 50.

The ceramic substrate 20 is a disc-shaped plate member formed of a fired body of a ceramic material. Examples of the ceramic material include aluminum nitride, silicon carbide, silicon nitride, and aluminum oxide.

The ceramic substrate 20 has a diameter of 320 mm to 385 mm and a thickness of 10 mm to 30 mm, for example. One main surface (an upper surface in FIG. 2) of the ceramic substrate 20 is to be a wafer mounting surface 22. The wafer mounting surface 22 may have a plurality of irregularities formed by embossing or a plurality of grooves.

The ceramic substrate 20 has a plurality of lift pin holes 60 being through holes. Support pins (lift pins) of the unillustrated semiconductor manufacturing apparatus capable of supporting the wafer mounted on the upper surface of the ceramic substrate from below and lifting the wafer are insertable into the plurality of lift pin holes 60. The plurality of lift pin holes 60 are arranged at positions equidistant from an axial center C of the ceramic substrate 20 (i.e., along a circle concentric with the ceramic substrate 20) circumferentially at regular angular intervals to be symmetric (symmetric with respect to a y axis in FIG. 1). While a case where three lift pin holes 60 (60a to 60c) are arranged to be symmetric is illustrated in FIG. 1, the number of lift pin holes 60 is not limited to three.

The other main surface (a lower surface in FIG. 2) of the ceramic substrate 20 is a connecting surface 24 to the shaft 50. The shaft 50 is a hollow cylindrical member formed of a fired body of a ceramic material similar to that for the ceramic substrate 20.

The ceramic substrate 20 has an inner zone 20a and an outer zone 20b defined by an imaginary bounding circle 26 considered as a circle concentric with the ceramic substrate 20. The inner zone 20a is a circular region inside the imaginary bounding circle 26. The outer zone 20b is an annular region outside the imaginary bounding circle 26. The imaginary bounding circle 26 is defined radially slightly inside the positions at which the lift pin holes 60 are arranged.

The inner zone heater 30 is embedded in the inner zone 20a, and the outer zone heater 40 is embedded in the outer zone 20b.

The inner zone heater 30 is a coil disposed over the whole of the inner zone 20a in a plane (in an xy plane) parallel to the wafer mounting surface 22 within the ceramic substrate 20. In a case illustrated in FIG. 1, the inner zone heater 30 is disposed as if it was drawn as one continuous stroke while being curvilinearly bent at bent portions 35 (35a to 35d) near a yz plane passing through the axial center C.

The outer zone heater 40 is a coil disposed over the whole of the outer zone 20b in the same plane (in the xy plane) as the plane in which the inner zone heater 30 is disposed within the ceramic substrate 20. In a case illustrated in FIG. 1, the outer zone heater 40 is disposed as if it was drawn as one continuous stroke while being curvilinearly bent at bent portions 47 (47a and 47b) near the yz plane passing through the axial center C.

As illustrated in FIG. 1, the inner zone heater 30 and the outer zone heater 40 are arranged in arcs equally spaced in a radial direction of the ceramic substrate 20, that is, in concentric arcs in a large portion excluding the bent portions 35 and the bent portions 47.

Exceptionally, the inner zone heater 30 and the outer zone heater 40 respectively locally have curved portions 36 and curved portions 48 near the lift pin holes 60 to suppress a temperature variation due to the presence of the lift pin holes 60.

For example, in a case illustrated in FIG. 1, the inner zone heater 30 have curved portions 36a, 36b, and 36c curved radially outward respectively near the lift pin holes 60a, 60b, and 60c.

The outer zone heater 40 also have curved portions 48a and 48b curved radially outward respectively near the lift pin holes 60a and 60b.

Examples of a material for the coils as the inner zone heater 30 and the outer zone heater 40 include molybdenum, tungsten, and a compound of molybdenum and tungsten.

Depending on a position in the inner zone 20a and the outer zone 20b, the number of turns per unit length of each of the coils as the inner zone heater 30 and the outer zone heater 40 may be changed as appropriate. In a case where the wafer is plasma heated, for example, the wafer sometimes has a temperature variation due to a partial difference in plasma heat input into the wafer, and the number of turns per unit length may be changed depending on the position to eliminate such a temperature variation. As the number of turns per unit length of the coil increases, the amount of generated heat increases, and a temperature comes to increase. Instead of changing the number of turns of the coil, a turning diameter or conductor spacing (spacing between adjacent portions of the coil) may be changed.

Opposite ends of the inner zone heater 30 are connected to a first feed terminal 31 and a second feed terminal 32 arranged in a central portion (near the axial center C) of the ceramic substrate 20. As illustrated in FIG. 2, the first feed terminal 31 and the second feed terminal 32 are arranged to be coplanar.

Opposite ends 40a and 40b of the outer zone heater 40 are respectively connected to one end of the first lead 41 and one end of the second lead 42, and the other end of the first lead 41 and the other end of the second lead 42 are respectively connected to a third feed terminal 43 and a fourth feed terminal 44 arranged near the axial center C of the ceramic substrate 20. As illustrated in FIG. 2, the third feed terminal 43 and the fourth feed terminal 44 are arranged to be coplanar.

The first lead 41 and the second lead 42 are arranged across the inner zone 20a. FIG. 2 schematically shows a state of the first lead 41 being disposed across the inner zone 20a in a plane perpendicular to a z axis. More specifically, the first lead 41 and the second lead 42 are arranged between two paired bent portions 35a and 35b of the inner zone heater 30 as illustrated in FIG. 1.

The first lead 41 and the second lead 42 include wires. Examples of a material for the wires include molybdenum, tungsten, and a compound of molybdenum and tungsten. A wire diameter of each of the wires is not particularly limited but is preferably 0.3 mm or more and 1.0 mm or less, for example.

In FIG. 1, the first lead 41 and the second lead 42 are linear along the y axis passing through the axial center C to be symmetric to each other. In other words, the first lead 41 and the second lead 42 are arranged along an axis of symmetry with respect to which the lift pin holes 60 are arranged to be symmetric. The first lead 41 and the second lead 42 are not necessarily required to be linear and may be tortuous (i.e., winding) or curved as a whole in plan view as long as they are symmetric to each other. In the present embodiment, a state of the first lead 41 and the second lead 42 being symmetric to each other includes a case where they are located to be substantially symmetric to each other, and misalignment inevitably occurring during the manufacture is allowed. For example, misalignment of approximately 4 mm or less from an original position at which they are symmetric to each other is allowed. Such a degree of misalignment does not deteriorate thermal uniformity described below.

A feed member 33 and a feed member 34 as feedlines from an inner zone heater power supply 37 are respectively connected to the second feed terminal 32 and the first feed terminal 31. A feed member 45 and a feed member 46 as feedlines from an outer zone heater power supply 49 are respectively connected to the third feed terminal 43 and the fourth feed terminal 44. Various types of connections, such as screwing, swaging, fitting, brazing, welding, and eutectic soldering, are applicable to these connections. The first feed terminal 31 and the first feed terminal 32 are arranged to be symmetric with respect to the y axis, and the third feed terminal 43 and the fourth feed terminal 44 are arranged to be symmetric with respect to the y axis.

The feed members 33, 34, 45, and 46 are arranged within the shaft 50. The feed members 33, 34, 45, and 46 are preferably formed of metal and is more preferably formed of nickel. The feed members 33, 34, 45, and 46 may be formed of a nickel alloy, such as Inconel (a registered trademark of Special Metal Corporation). The feed members 33, 34, 45, and 46 may each be a composite material formed of tungsten/nickel. Examples of the shape of each of the feed members 33, 34, 45, and 46 include a rod shape, a wire shape, and the like.

Operation of the inner zone heater power supply 37 and operation of the outer zone heater power supply 49 are controlled by a controller 52. The multi-zone heater 10 according to the present embodiment can thus perform temperature control in the inner zone 20a and temperature control in the outer zone 20b independently of each other. In other words, the multi-zone heater 10 is configured to heat the inner zone 20a and the outer zone 20b outside the inner zone 20a with separate heaters independently of each other.

<Details of Arrangement Relationship Among Components>

Arrangement of components of the multi-zone heater 10 according to the present embodiment having a configuration as illustrated in FIG. 1 is determined in terms of securement of thermal uniformity at the wafer mounting surface 22.

Specifically, the inner zone heater 30 and the outer zone heater 40 are arranged in concentric arcs in the large portion while having the bent portions 35 and the bent portions 47. The shapes in the bent portions 35 and the bent portions 47 are determined to suppress a temperature variation due to bending.

The inner zone heater 30 and the outer zone heater 40 respectively have the curved portions 36 and the curved portions 48 near the lift pin holes 60 to suppress a temperature variation due to the presence of the lift pin holes 60.

The radius of curvature in the bent portions 35, the bent portions 47, the curved portions 36, and the curved portions 48 is significantly different from that in the concentric arcuate portions of the inner zone heater 30 and the outer zone heater 40, so that these portions are also referred to as curvature radius singular points.

In other words, the inner zone heater 30 and the outer zone heater 40 are arranged to suppress a temperature variation at the curvature radius singular points in the multi-zone heater 10.

Furthermore, in this case, the inner zone heater 30, the outer zone heater 40, and the lift pin holes 60 are arranged to be symmetric with respect to a common axis of symmetry. In a case illustrated in FIG. 1, these components are arranged to be symmetric with respect to the y axis to achieve symmetric arrangement.

In addition, in the multi-zone heater 10 according to the present embodiment, the first lead 41 and the second lead 42 are arranged along the axis of symmetry of the symmetric arrangement. With the arrangement of the first lead 41 and the second lead 42, the bent portions 35 of the inner zone heater 30 and the bent portions 47 of the outer zone heater 40 are arranged to be symmetric.

Although the first lead 41 and the second lead 42 are located between the paired bent portions 35 (35a and 35b) and between the paired bent portions 47 (47a and 47b) as the curvature radius singular points, the multi-zone heater 10 having a configuration as described above has higher thermal uniformity than a multi-zone heater having a configuration in which the first lead 41 and the second lead 42 are arranged at positions different from a position of the axis of symmetry with respect to which the lift pin holes 60 are arranged to be symmetric.

Figure 3:
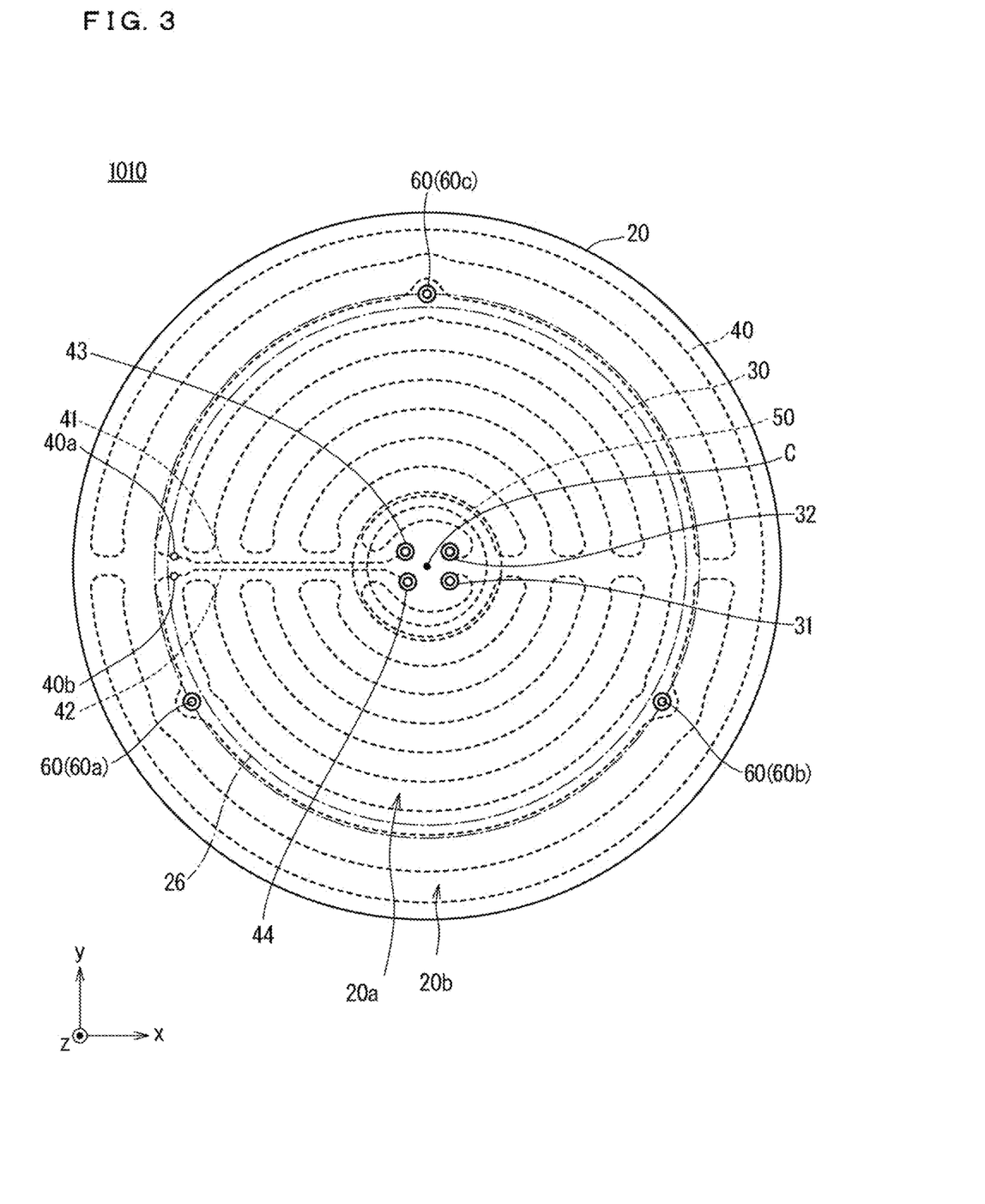
FIG. 3 is a schematic plan view of an asymmetric multi-zone heater 1010.

FIG. 3 is a schematic plan view of a multi-zone heater (hereinafter an asymmetric multi-zone heater) 1010 including the first lead 41 and the second lead 42 arranged at the positions different from the position of the axis of symmetry with respect to which the lift pin holes 60 are arranged to be symmetric shown for comparison.

The asymmetric multi-zone heater 1010 is the same as the multi-zone heater 10 illustrated in FIG. 1 in terms of the inner zone heater 30 embedded in the inner zone 20a, the outer zone heater 40 embedded in the outer zone 20b, and arrangement of the lift pin holes 60, but a large portion of the first lead 41 and a large portion of the second lead 42 are linear along an x axis passing through the axial center C to be symmetric to each other. The bent portions of the inner zone heater 30 and the outer zone heater 40 are thus arranged along the x axis. As a result, the first lead 41 and the second lead 42 are arranged at the positions different from the position of the axis of symmetry with respect to which the lift pin holes 60 are arranged to be symmetric. However, the first feed terminal 31 and the first feed terminal 32 are arranged to be symmetric with respect to the x axis, and the third feed terminal 43 and the fourth feed terminal 44 are arranged to be symmetric with respect to the x axis.

Figure 4:
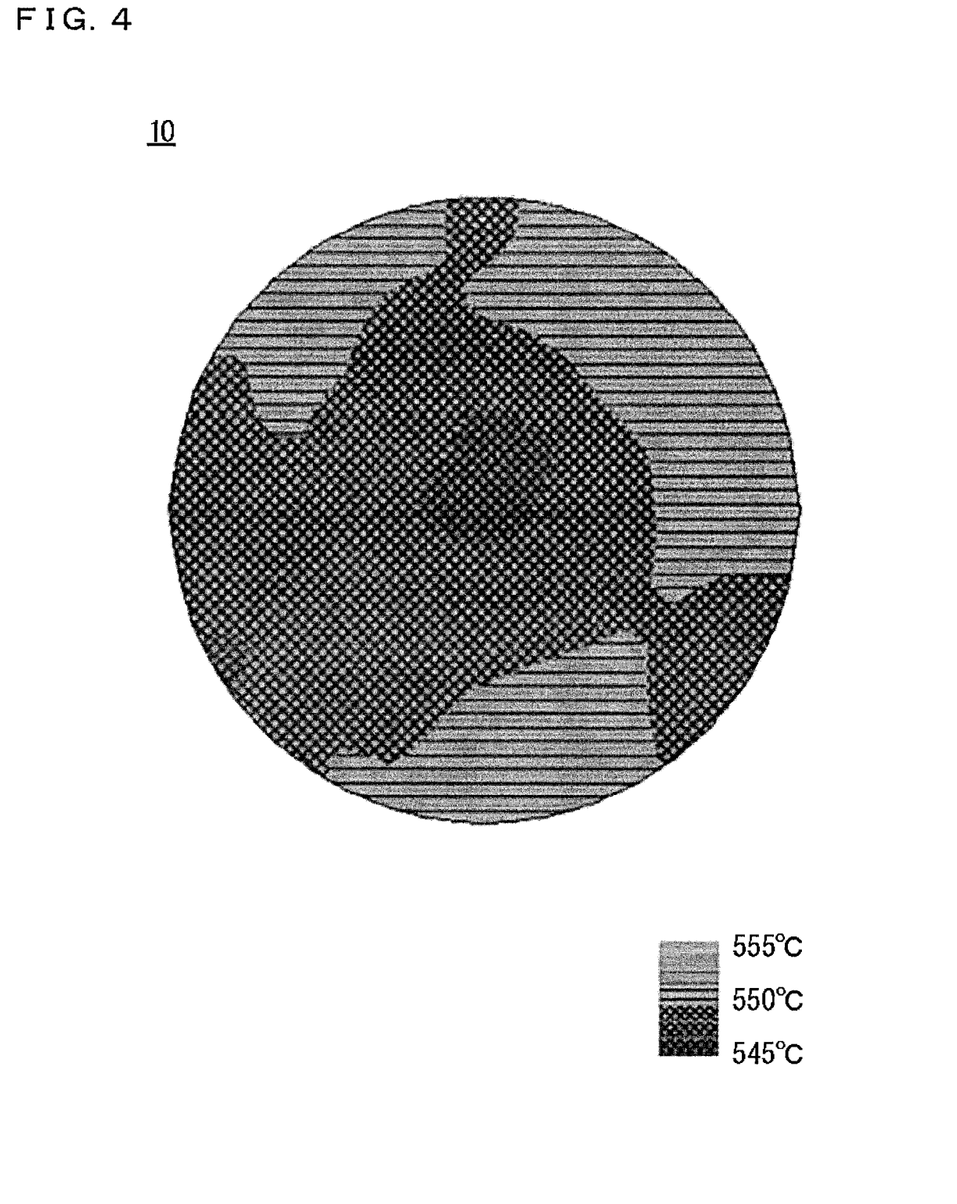
FIG. 4 is an illustration of temperature distribution at a wafer mounting surface 22 when the multi-zone heater 10 performs heating.
Figure 5:
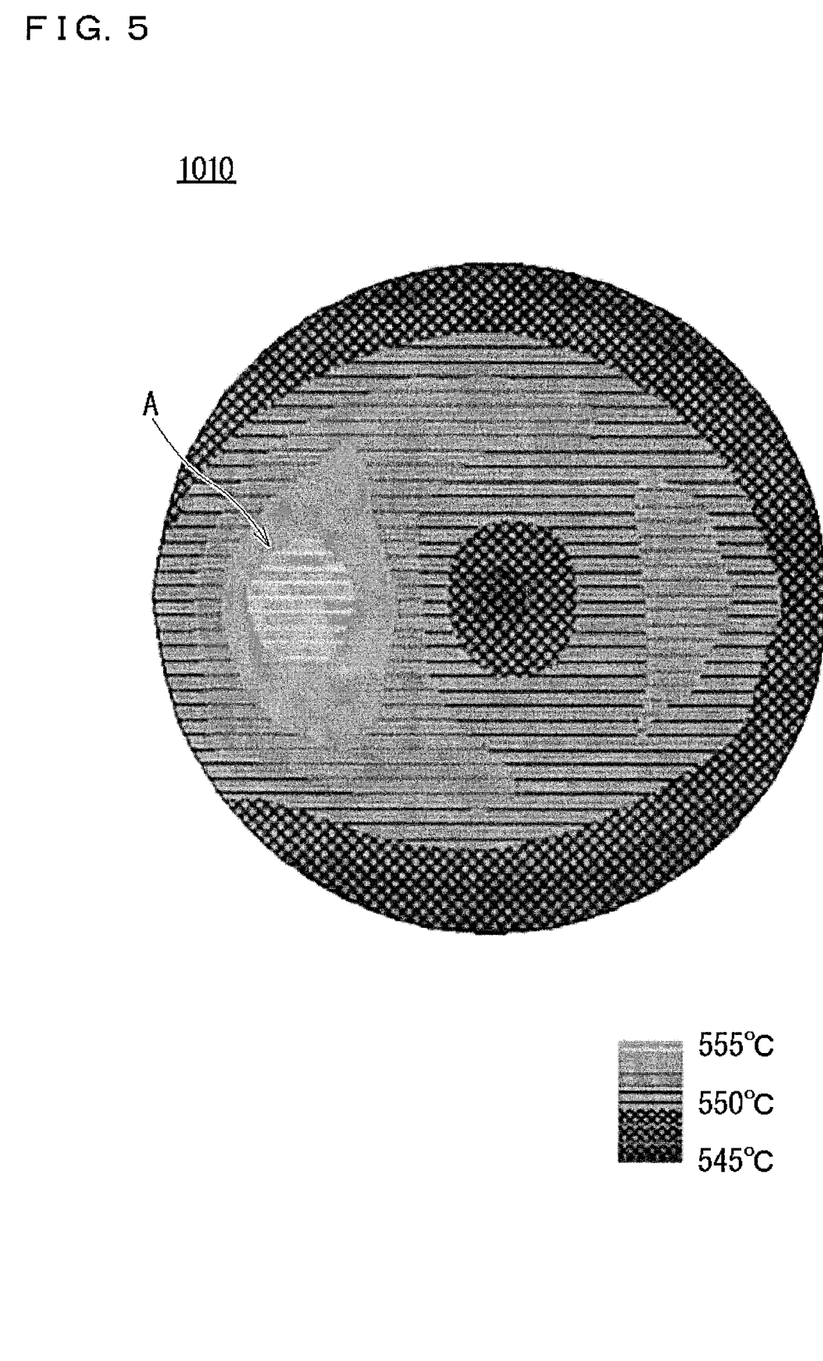
FIG. 5 is an illustration of temperature distribution at the wafer mounting surface 22 when the asymmetric multi-zone heater 1010 performs heating.

FIGS. 4 and 5 are illustrations of results of measurement of temperature distribution at the wafer mounting surface 22 using a radiation thermometer when the multi-zone heater 10 and the asymmetric multi-zone heater 1010 performed heating at a set temperature of 550° C.

In a case of the multi-zone heater 10 according to the present embodiment illustrated in FIG. 4, temperature distribution at the wafer mounting surface 22 was generally uniform, and a maximum temperature was 552.1° C. and a minimum temperature was 548.9° C. That is to say, a temperature variation (a difference value between the maximum temperature and the minimum temperature) fell within 3.2° C.

In contrast, in a case of the asymmetric multi-zone heater 1010 illustrated in FIG. 5, the maximum temperature was 557.5° C. and the minimum temperature was 547.7° C., and the presence of a hot spot A as a local high temperature region was confirmed. The temperature variation reached 9.8° C. It can be seen from comparison between FIGS. 3 and 5 that the hot spot A is formed at a position at which the first lead 41 and the second lead 42 are arranged.

These results indicate that, in the multi-zone heater 10, the first lead 41 and the second lead 42 to feed the outer zone heater 40 are preferably arranged at the position of the axis of symmetry with respect to which the lift pin holes 60 for the lift pins are arranged to be symmetric, thereby to secure thermal uniformity at the wafer mounting surface 22.

The first lead 41 and the second lead 42 are preferably short in terms of suppression of a temperature variation due to the presence of the first lead 41 and the second lead 42. This means that the imaginary bounding circle 26 preferably has a small diameter. As the first lead 41 and the second lead 42 decrease in length, however, the inner zone 20a decreases in size, and the outer zone 20b increases in size, resulting in imbalance between them. In terms of a preferable balance between heating of the inner zone 20a with the inner zone heater 30 and heating of the outer zone 20b with the outer zone heater 40, the imaginary bounding circle 26 preferably has a diameter that is approximately 51% to 82% of the diameter of the ceramic substrate 20. The imaginary bounding circle 26 having a diameter that is less than 51% of the diameter of the ceramic substrate 20 is not preferable as the outer zone heater 40 heats a portion other than an edge of the wafer, and a tendency toward difficulty in temperature adjustment in an edge portion becomes noticeable. On the other hand, the imaginary bounding circle 26 having a diameter that is more than 86% of the diameter of the ceramic substrate 20 causes a problem in that temperature adjustability in the outer zone 20b is significantly reduced. For example, in a case where the ceramic substrate 20 has a diameter of 330 mm, the imaginary bounding circle 26 preferably has a diameter of 200 mm to 260 mm. The diameter of the imaginary bounding circle 26 is herein defined as an average value (an intermediate value) between a PCD of a portion of the inner zone heater 30 located farthest from the axial center C and a PCD of a portion of the outer zone heater 40 located closest to the axial center C.

<Another Aspect>

Figure 6:
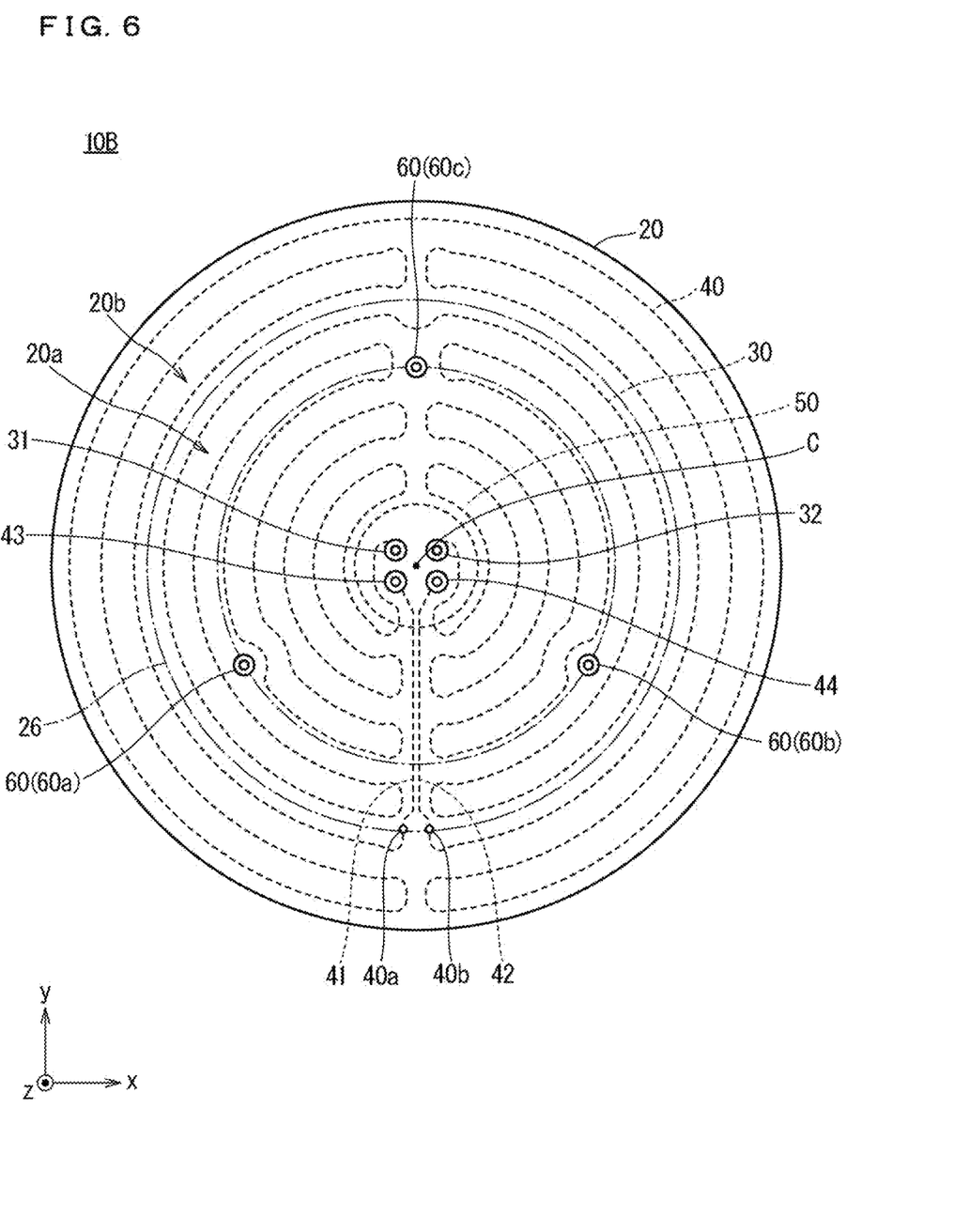
FIG. 6 is a schematic plan view of a multi-zone heater 10B.

FIG. 6 is a schematic plan view of a multi-zone heater 10B according to another aspect of the multi-zone heater 10 illustrated in FIG. 1.

The multi-zone heater 10B has the same configuration as the multi-zone heater 10 except that the three lift pin holes 60 (60a to 60c) are provided in the inner zone 20a, and thus the inner zone heater 30 and the outer zone heaters 40 are locally curved in a different manner. That is to say, the first lead 41 and the second lead 42 are arranged in the same manner as those of the multi-zone heater 10.

The lift pin holes 60 are only required to be provided along a circle concentric with the ceramic substrate 20 and having a diameter that is 46% to 88% of the diameter of the ceramic substrate 20. The lift pin holes 60 provided along a circle not satisfying the diameter range is not preferable as support of the wafer by the lift pins becomes unstable, and the wafer might fall. For example, in a case where the ceramic substrate 20 has a diameter of 330 mm, the lift pin holes 60 are preferably provided along a circle having a diameter of 180 mm to 280 mm.

Figure 7:
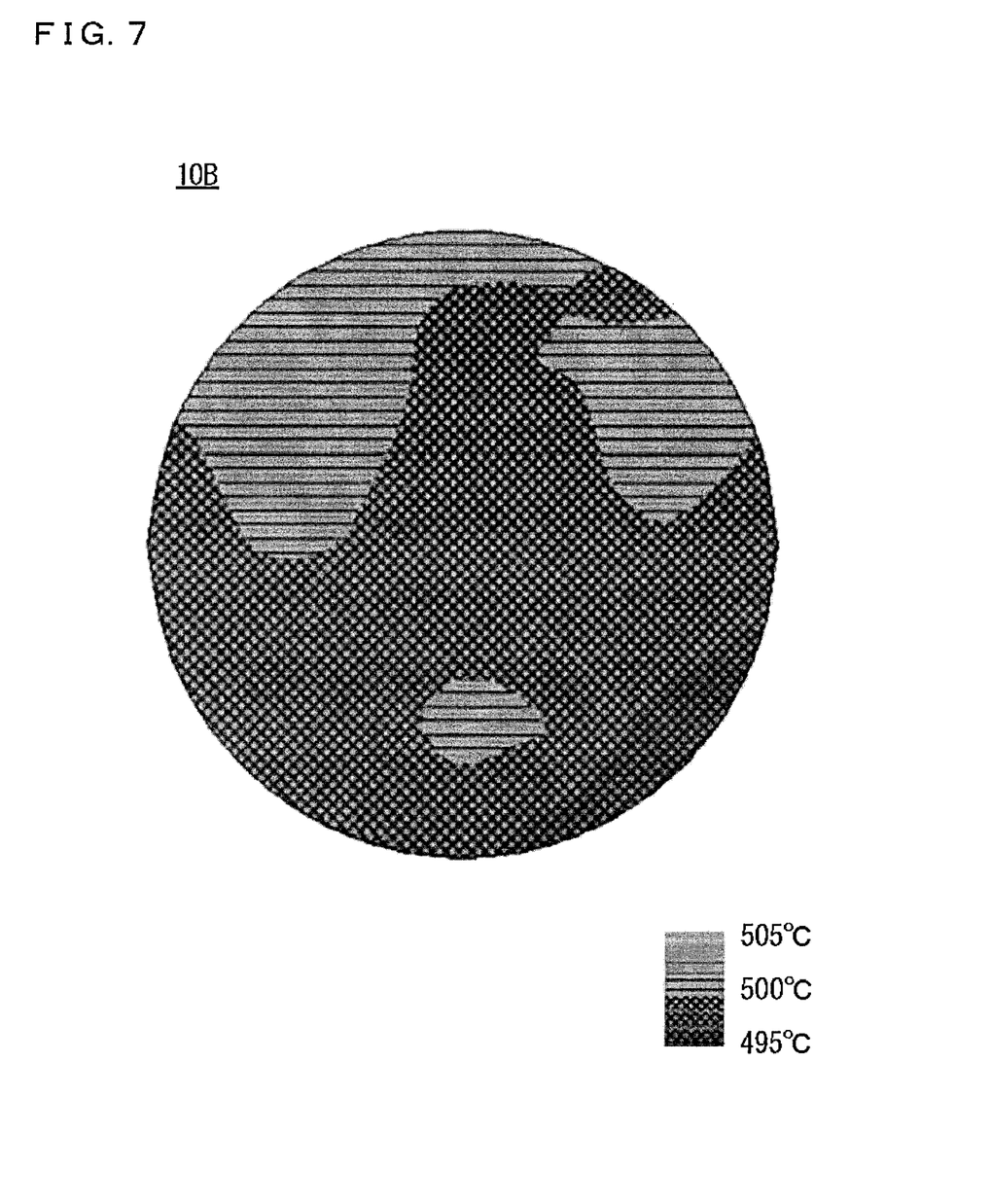
FIG. 7 is an illustration of temperature distribution at the wafer mounting surface 22 when the multi-zone heater 10B performs heating.

FIG. 7 is an illustration of a result of measurement of temperature distribution at the wafer mounting surface 22 using the radiation thermometer when the multi-zone heater 10B performed heating at a set temperature of 500° C.

In a case of the multi-zone heater 10B illustrated in FIG. 7, temperature distribution at the wafer mounting surface 22 was also generally uniform, and the maximum temperature was 499.2° C. and the minimum temperature was 495.9° C. That is to say, the temperature variation fell within 3.3° C.

The result also indicates that the first lead 41 and the second lead 42 to feed the outer zone heater 40 are preferably arranged at the position of the axis of symmetry with respect to which the lift pin holes 60 for the lift pins are arranged to be symmetric, thereby to secure thermal uniformity at the wafer mounting surface 22.

Figure 8:
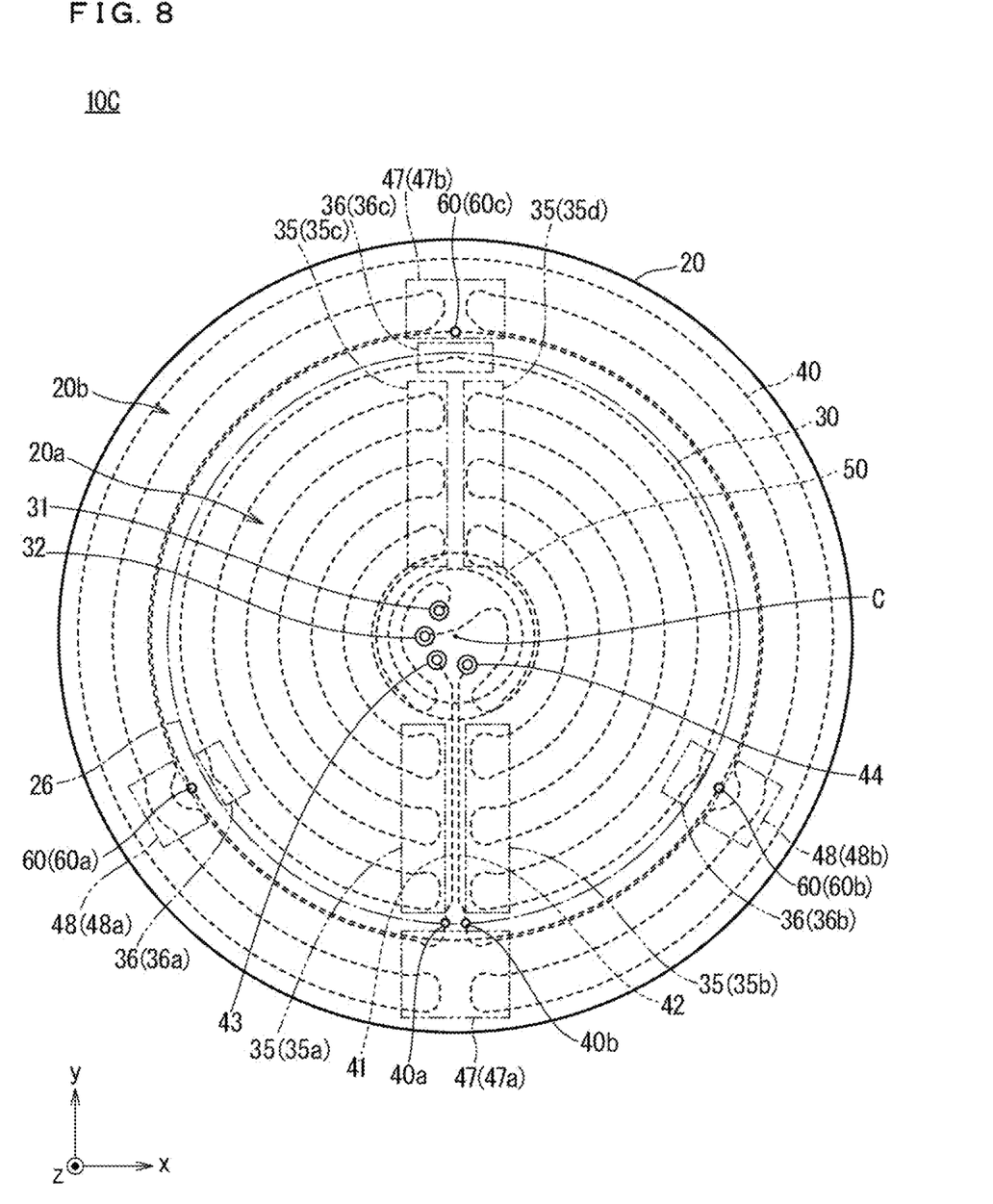
FIG. 8 is a schematic plan view of a multi-zone heater 10C.

FIG. 8 is a schematic plan view of a multi-zone heater 10C according to yet another aspect of the multi-zone heater 10 illustrated in FIG. 1.

The multi-zone heater 10C has the same configuration as the multi-zone heater 10 except that the first feed terminal 31 and the second feed terminal 32 are not arranged to be symmetric with respect to the y axis, the third feed terminal 43 and the fourth feed terminal 44 are not arranged to be symmetric with respect to the y axis, and thus the first lead 41 and the second lead 42 are not arranged to be symmetric with respect to the y axis only in a range located inside the shaft 50 in plan view.

As long as the first lead 41 and the second lead 42 are arranged to be symmetric with respect to the common axis of symmetry with respect to which the lift pin holes 60, the inner zone heater 30, and the outer zone heater 40 are arranged to be symmetric at least in a range located outside the shaft 50 in plan view, however, thermal uniformity at the wafer mounting surface when the heater performs heating is increased. That is to say, thermal uniformity at the wafer mounting surface 22 is not affected by the first feed terminal 31 and the second feed terminal 32 arranged to be asymmetric, the third feed terminal 43 and the fourth feed terminal 44 arranged to be asymmetric, and therefore the first lead 41 and the second lead 42 arranged to be asymmetric in the range located inside the shaft 50 in plan view as in the multi-zone heater 10C.

In other words, this means that, thermal uniformity at the wafer mounting surface when the heater performs heating is increased in the case that the first lead 41 and the second lead 42 are arranged to be symmetric with respect to the common axis of symmetry with respect to which the lift pin holes 60, the inner zone heater 30, and the outer zone heater 40 are arranged to be symmetric at least in the range located outside the shaft 50 in plan view, including in the multi-zone heater 10 and the multi-zone heater 10B.

As described above, according to the present embodiment, in the multi-zone heater including the ceramic substrate having one main surface to be a mounting surface on which the semiconductor wafer is mounted and having the plurality of lift pin holes into which the lift pins to lift the semiconductor wafer are inserted, and capable of heating the inner zone in the central portion and the outer zone in the portion outside the central portion of the ceramic substrate with the separate heaters independently of each other, the lift pin holes, the inner zone heater, and the outer zone heater are arranged to be symmetric with respect to the common axis of symmetry, and the leads to feed the outer zone heater are arranged along the axis of symmetry to be symmetric to each other. In the multi-zone heater having such a configuration, thermal uniformity at the wafer mounting surface when the heater performs heating can be increased compared with the multi-zone heater in which the leads are not arranged along the axis of symmetry.

Modifications

While the lift pin holes 60 are arranged along the circle concentric with the ceramic substrate 20 at regular angular intervals in the above-mentioned embodiment, an aspect in which the lift pin holes 60 are arranged at irregular angular intervals is also allowed. For example, the three lift pin holes may be arranged along the circle concentric with the ceramic substrate 20 in an isosceles triangle except an equilateral triangle.

Furthermore, in the above-mentioned embodiment, the first feed terminal 31 and the second feed terminal 32 are arranged to be coplanar, the third feed terminal 43 and the fourth feed terminal 44 are arranged to be coplanar, and the inner zone heater 30 and the outer zone heater 40 are two-dimensionally arranged in the xy plane.

Instead, the first feed terminal 31 and the second feed terminal 32 may vertically be arranged along the z-axis direction, and the inner zone heater 30 may three-dimensionally be disposed not only in the xy plane but also in the z-axis direction. Similarly, the third feed terminal 43 and the fourth feed terminal 44 may vertically be arranged along the z-axis direction, and the outer zone heater 40 may three-dimensionally be disposed not only in the xy plane but also in the z-axis direction.

While the invention has been shown and described in detail, the foregoing description is in all aspects illustrative and not restrictive. It is therefore understood that numerous modifications and variations can be devised without departing from the scope of the invention.

What is claimed is:

1. A multi-zone heater comprising:
   a disc-shaped ceramic substrate having one main surface to be a wafer mounting surface, the multi-zone heater being capable of heating a wafer mounted on the one main surface;
   a plurality of lift pin holes which are provided in the ceramic substrate and into which lift pins to lift the wafer are insertable;
   an inner zone heater embedded in an inner zone of the ceramic substrate and formed of concentric arcs;
   an outer zone heater embedded in an outer zone outside the inner zone of the ceramic substrate and formed of concentric ares;
   a first feed terminal and a second feed terminal which are arranged in a central portion of the ceramic substrate and to which opposite ends of the inner zone heater are connected;
   a first lead and a second lead to which opposite ends of the outer zone heater are connected; and
   a third feed terminal and a fourth feed terminal which are arranged in the central portion of the ceramic substrate and to which the first lead and the second lead are respectively connected, wherein
   the plurality of lift pin holes, the inner zone heater, and the outer zone heater are arranged to be symmetric with respect to a common axis of symmetry that is along a radial direction of the ceramic substrate, and
   the first lead and the second lead are arranged along the axis of symmetry to be symmetric to each other and are also symmetric with respect to the plurality of lift pin holes, and
   wherein the inner zone heater includes curved portions curved radially outward toward the plurality of lift pin holes,
   wherein the outer zone heater includes curved portions curved radially away from the plurality of lift pin holes, and
   wherein the plurality of lift pin holes are arranged between the inner zone heater and the outer zone heater.

2. The multi-zone heater according to claim 1, wherein the plurality of lift pin holes are provided along a circle concentric with the ceramic substrate.

3. The multi-zone heater according to claim 2, wherein the circle concentric with the ceramic substrate has a diameter that is 46% to 88% of a diameter of the ceramic substrate.

4. The multi-zone heater according to claim 1, wherein the inner zone and the outer zone are defined by an imaginary bounding circle concentric with the ceramic substrate, and the bounding circle has a diameter that is 51% to 82% of a diameter of the ceramic substrate.

5. The multi-zone heater according to claim 2, wherein the inner zone and the outer zone are defined by an imaginary bounding circle concentric with the ceramic substrate, and the bounding circle has a diameter that is 51% to 82% of a diameter of the ceramic substrate.

6. The multi-zone heater according to claim 3, wherein the inner zone and the outer zone are defined by an imaginary bounding circle concentric with the ceramic substrate, and the bounding circle has a diameter that is 51% to 82% of the diameter of the ceramic substrate.

7. The multi-zone heater according to claim 1, wherein the outer zone heater includes curved portions curved radially outward near the plurality of lift pin holes.

* * * * *